US011669012B2

(12) United States Patent
Xu et al.

(10) Patent No.: US 11,669,012 B2
(45) Date of Patent: Jun. 6, 2023

(54) MASKLESS LITHOGRAPHY METHOD TO FABRICATE TOPOGRAPHIC SUBSTRATE

(71) Applicant: Applied Materials, Inc., Santa Clara, CA (US)

(72) Inventors: Yongan Xu, Santa Clara, CA (US); Ludovic Godet, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 518 days.

(21) Appl. No.: 16/798,261

(22) Filed: Feb. 21, 2020

(65) Prior Publication Data

US 2021/0263410 A1  Aug. 26, 2021

(51) Int. Cl.
| | |
|---|---|
| G03F 7/00 | (2006.01) |
| G03F 7/004 | (2006.01) |
| G03F 7/038 | (2006.01) |
| G03F 7/20 | (2006.01) |

(52) U.S. Cl.
CPC .......... *G03F 7/0005* (2013.01); *G03F 7/0043* (2013.01); *G03F 7/038* (2013.01); *G03F 7/2022* (2013.01)

(58) Field of Classification Search
CPC ...... G03F 7/0005; G03F 7/0043; G03F 7/038; G03F 7/2022; G03F 7/2051
See application file for complete search history.

(56) References Cited

U.S. PATENT DOCUMENTS

| 7,824,842 | B2 | 11/2010 | Finders |
| 8,907,307 | B2 | 12/2014 | Leavitt et al. |
| 2006/0068334 | A1 | 3/2006 | Sandstrom et al. |
| 2008/0231826 | A1* | 9/2008 | Desmedt ............ G03F 7/70291 355/53 |
| 2008/0252871 | A1* | 10/2008 | Sato .................... G03F 7/70575 355/71 |
| 2009/0225294 | A1 | 9/2009 | Okano |
| 2012/0295185 | A1 | 11/2012 | Chang et al. |
| 2014/0193757 | A1 | 7/2014 | Ogihara et al. |

FOREIGN PATENT DOCUMENTS

| JP | 2009-105252 A | 5/2009 |
| WO | 2016-205249 A1 | 12/2016 |
| WO | WO 2019-239139 | * 12/2019 |
| WO | WO 2020-030855 | * 2/2020 |

OTHER PUBLICATIONS

International Search Report and Written Opinion for PCT/US2021/012521 dated Apr. 28, 2021.

* cited by examiner

*Primary Examiner* — Brittany L Raymond
(74) *Attorney, Agent, or Firm* — Patterson + Sheridan, LLP

(57) ABSTRACT

In one embodiment, a method of fabricating a device having at least two features of differing heights comprises: depositing a resist over a substrate; determining a topography pattern for the at least two features of the device; determining an exposure pattern for the at least two features of the device; exposing a first area of the resist with a first dose of light, the first area corresponding to a first feature of the at least two features; exposing a second area of the resist with a second dose of light that is different from the first dose of light, the second area corresponding to a second feature of the at least two features; and developing the resist.

20 Claims, 7 Drawing Sheets

MASKLESS LITHOGRAPHY METHOD TO FABRICATE TOPOGRAPHIC SUBSTRATE

BACKGROUND

Field

Embodiments of the present disclosure generally relate to optical and photonic devices. More specifically, embodiments described herein relate to a method of forming a topographic substrate by a maskless lithography.

Description of the Related Art

Optical and photonic devices may be used to manipulate the propagation of light by spatially varying structural patterns of the optical or photonic devices formed on a substrate. In some optical and photonic devices, the desired pattern area will have different heights to achieve the ideal optical performance. Such devices include an augmented reality (AR) device or a virtual reality (VR) device.

To obtain the desired pattern area with different heights, a different lithographic process, with corresponding mask, is utilized for each pattern area that has different heights. As is easy to imagine, the more pattern areas, the more lithographic processes occur, and the more masks are utilized. As more lithographic processes are performed, and hence more masks are utilized, processes tend to take longer. For example, two different features having different heights would require two different lithographic processes with to different masks. Adding a third feature would increase the processing time to produce the three different features by 50%.

Therefore, there is a need in the art for a method to create multiple features on a substrate having different heights without the need for independent lithographic processes for each feature.

SUMMARY

Utilizing a maskless lithographic process, a substrate having multiple topographical features can be produced without the need for independent lithographic processes for each feature.

In one embodiment, a method of fabricating a device having at least two features of differing heights comprises: depositing a resist over a substrate; determining a topography pattern for the at least two features of the device, the two features having different topography; determining an exposure pattern for the at least two features of the device; exposing a first area of the resist with a first dose of light, the first area corresponding to a first feature of the at least two features; exposing a second area of the resist with a second dose of light that is different from the first dose of light, the second area corresponding to a second feature of the at least two features; and developing the resist.

In another embodiment, a method of fabricating a device having at least two features of differing heights comprises: depositing a resist over a substrate; determining a topography pattern for the at least two features of the device, the two features having different topography; adjusting a plurality of blades of an exposure apparatus to create a first exposure area that corresponds to a first feature of the at least two features; exposing a first area of the resist with a first dose of light, the first area of the substrate corresponding to the first exposure area; adjusting the plurality of blades to create a second exposure area that corresponds to a second feature of the at least two features; exposing a second area of the resist with a second dose of light that is different from the first dose of light, the second area of the substrate corresponding to the second exposure area; and developing the resist.

In another embodiment, a method of fabricating a device having at least two features of differing heights comprises: depositing a resist on an optical device layer, the optical device layer disposed over a substrate; determining a topography pattern for the at least two features of the device, the two features having different topography; determining an exposure pattern for the at least two features of the device; exposing a first area of the resist with a first dose of light, the first area corresponding to a first feature of the at least two features; exposing a second area of the resist with a second dose of light that is different from the first dose of light, the second area corresponding to a second feature of the at least two features; developing the resist; and etching the resist and the optical device layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to an apparatus and method for fabricating a topographic substrates. Utilizing a maskless lithographic process, a substrate having multiple topographical features can be produced without the need for independent lithographic processes for each feature.

Figure 1:
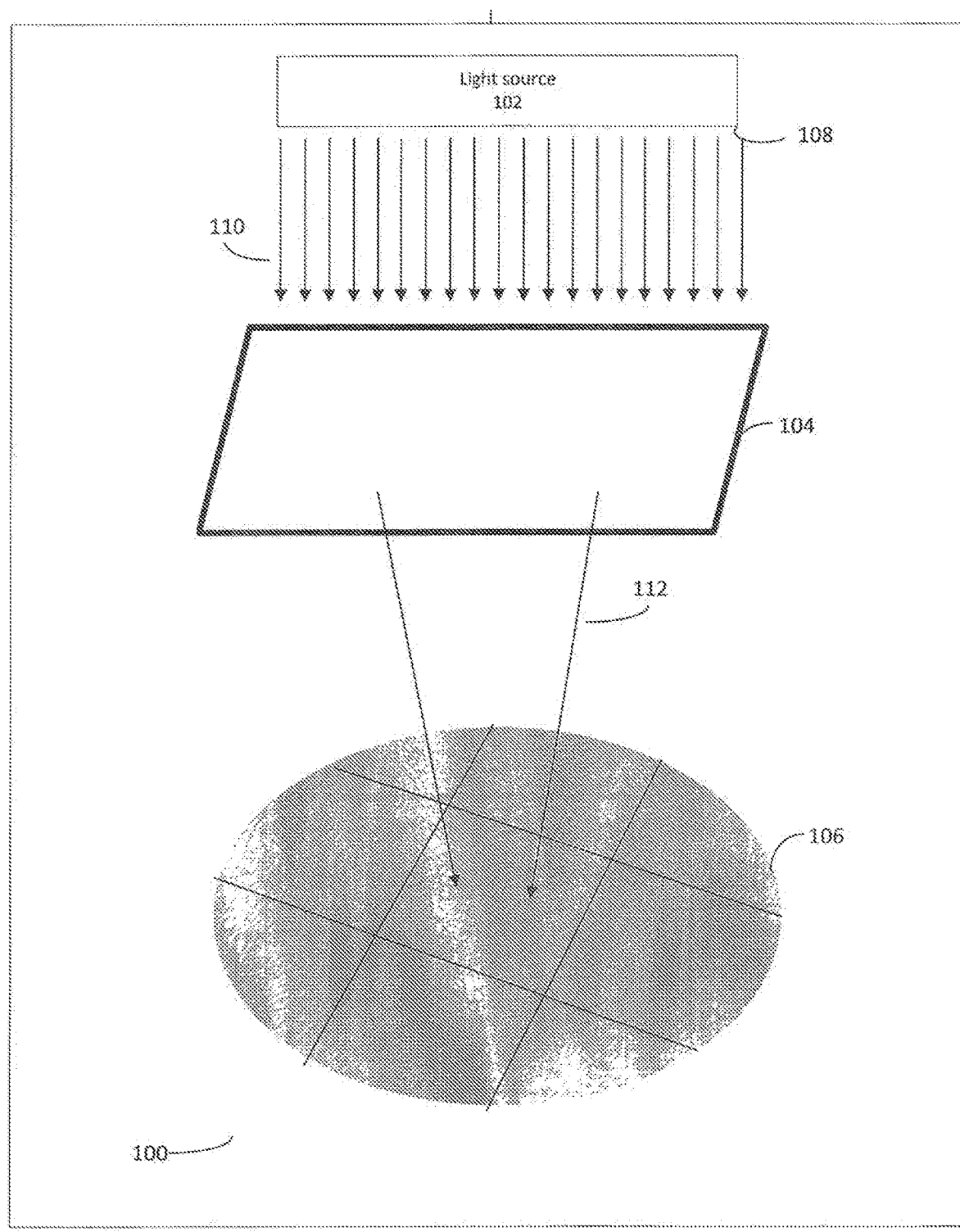
FIG. 1 is a schematic illustration of a processing apparatus according to one embodiment.

FIG. 1 is a schematic illustration of a processing apparatus 100 for processing substrates according to one embodiment. The apparatus 100 comprises a light source 102 and a reticle 104. As shown in FIG. 1, a substrate 106 is disposed in the apparatus 100 for processing. The apparatus 100 operates by delivering light 110 from a light source 102, through the reticle 104 onto a specific area of the substrate 106. The light 110, once passing through the reticle, is focused light 112 on the specific location of the substrate 106 that is to be exposed to the light 112.

Figure 2A:
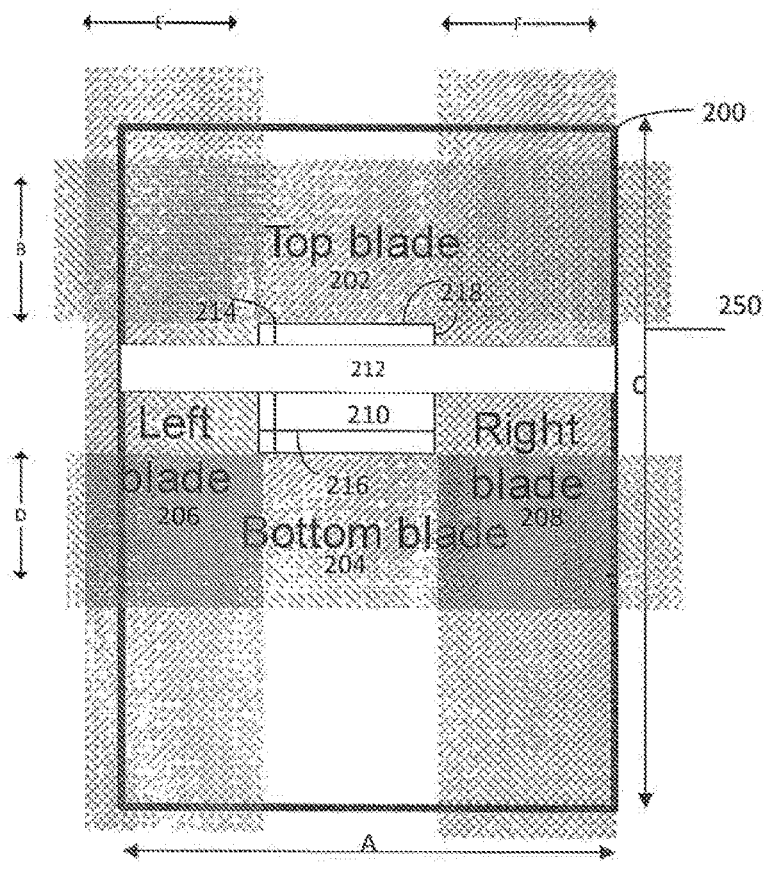
FIGS. 2A and 2B are schematic illustrations of a reticle used in the processing apparatus of FIG. 1 according to one embodiment.
Figure 2B:
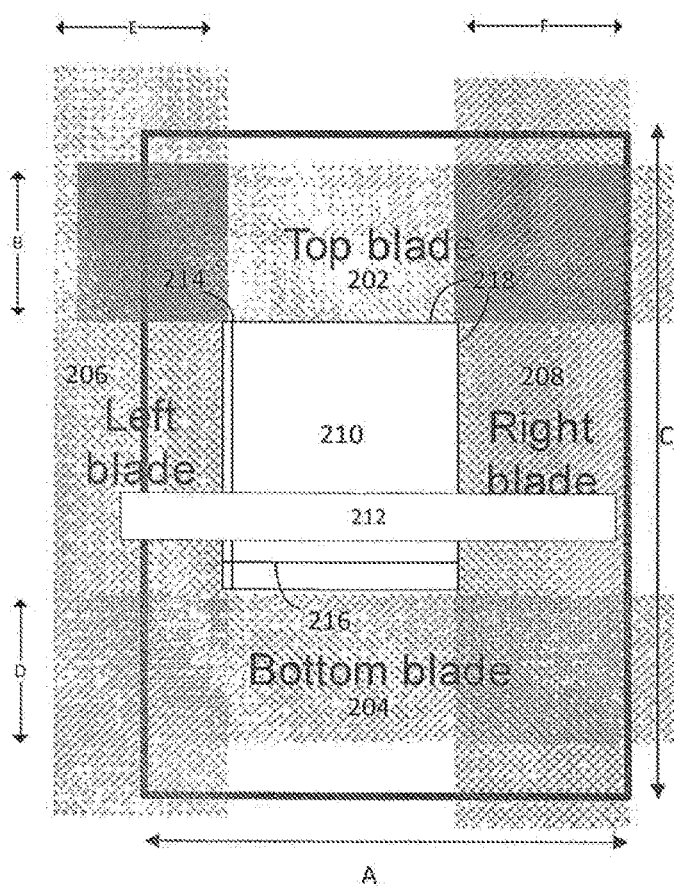

FIGS. 2A and 2B are schematic illustrations of a reticle 104 used in the processing apparatus 100 of FIG. 1 according to one embodiment. The reticle 104 includes a top blade 202, a bottom blade 204, a left blade 206, and a right blade 208. The top blade 202 has a width that is at least equal to the width of the reticle body 250 represented by arrow "A". Similarly, the bottom blade 204 has a width that is at least equal to the width of the reticle body 250. The top blade 202 has a height represented by arrow "B" that is less than a height of the reticle body 250 represented by arrow "C". The bottom blade 204 has a height represented by arrow "D" that is less than a height of the reticle body 250 represented by arrow "C". The left blade 206 has a width represented by arrow "E" that is less than the width of the reticle body 250 represented by arrow "A". The left blade 206 also has a height that is at least equal to the height of the reticle body represented by arrow "C". The right blade 208 has a width represented by arrow "F" that is less than the width of the reticle body 250 represented by arrow "A". The left blade 206 also has a height that is at least equal to the height of the reticle body represented by arrow "C". The reticle here could be just a dummy one, which is physically not existing on the tool, or maskless.

FIG. 2A is a top view of the reticle 200. In one embodiment, the reticle 200 is generally 26 millimeters wide (shown by arrow "A") and 33 millimeters long (shown by arrow "C"). The blades 202, 204, 206, and 208 create an exposure window 210. The size of the area of the exposure window 210 is defined by the area on the substrate that is to be exposed. The blades 202, 204, 206, and 208 define the edges 218 of the exposure window 210. The top blade 202 and the bottom blade 204 define a height 214 of an exposure window 210. The left blade 206 and the right blade 208 define a width 216 of an exposure window 210. The blades 202, 204, 206, 208 are movable to expand to change or define the exposure window 210. For example, the top blade 202 may be moved closer to or further from the bottom blade 204, or vice versa, to increase or decrease the height 214 of the exposure window 210. Similarly, the left blade 206 may be moved closer to or further from the right blade 208, or vice versa, to increase or decrease the width 216 of the exposure window.

FIG. 2B depicts the reticle 200 with blades 202, 204, 206, and 208 in a different position than shown in FIG. 2A such that a larger exposure window 218 is present (i.e., height 214 is greater in FIG. 2B versus FIG. 2A and width 216 is greater in FIG. 2B verses FIG. 2A).

In operation, light source 102 has an opening in the form of a slit 212. The slit 212 scans the exposure window 210 from the top blade 202 to the bottom blade 204. The light 110 from the light source 102 passes through the exposure window 210 forming a device pattern on the substrate. As shown in FIGS. 2A and 2B, the slit 212 moves relative to the reticle 104 such that the entire exposure window 210 is exposed.

Figure 3:
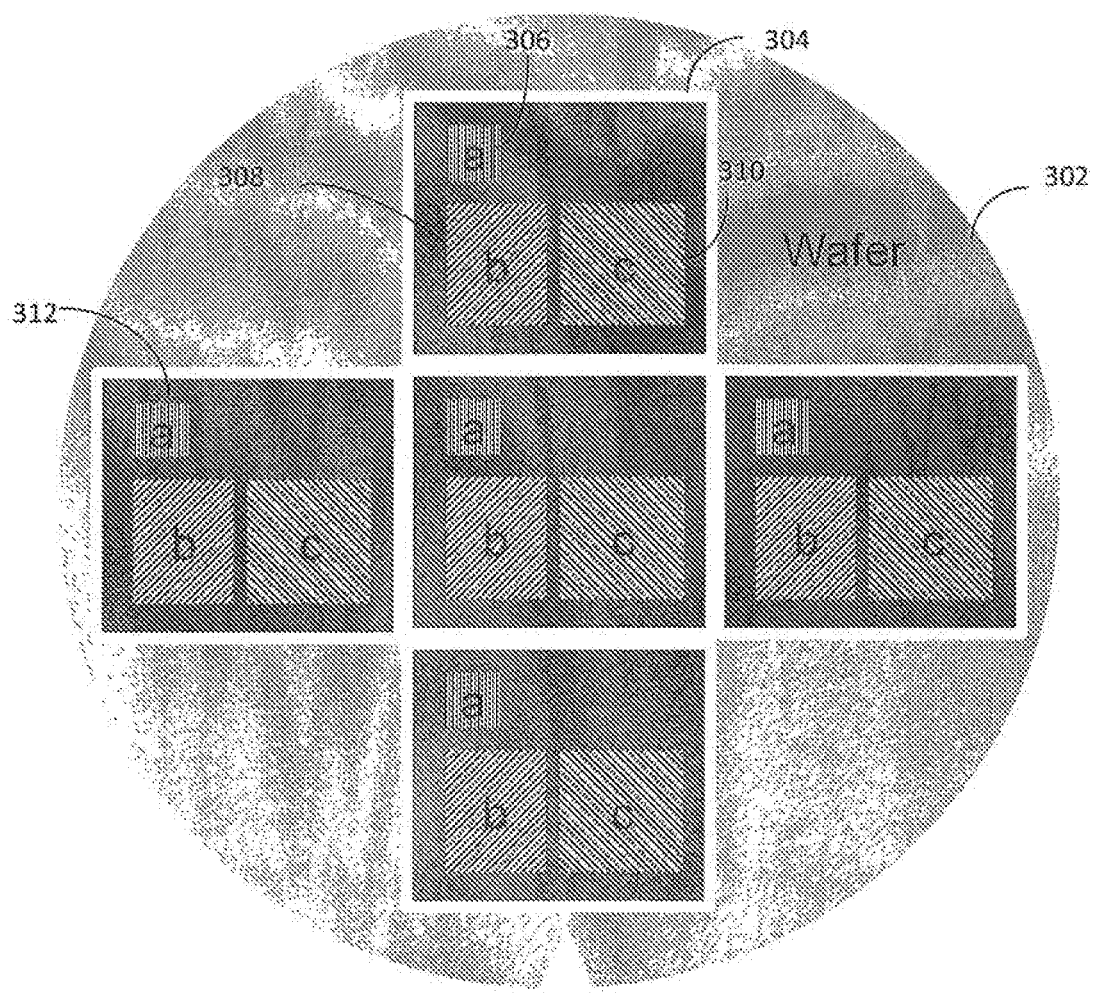
FIG. 3 is a schematic illustration of a substrate having desired exposure patterns according to one embodiment.

FIG. 3 is a schematic illustration of a substrate 302 having desired exposure patterns 306, 308, and 310 according to one embodiment. In this embodiment, patterns 306, 308, and 310 each have different sizes and/or heights. Each exposure pattern 306, 308, 310 is unique with different sizes and positions inside the die 304. Accuracy of the pattern location relative to the die size is desired. In one embodiment, each exposure pattern 306, 308, 310 can be placed at a specific location inside the die 304 with an accuracy of less than 1 nanometer.

In operation, light from the light source 102 is delivered to the reticle 104 in the form of a slit 212. The light 110 from the light source 102 passes through the exposure window 210 forming a device pattern, such as patterns 306, 308, and 310, in the resist 312. The slit 212 scans the exposure window 210, exposing the device patterns 306, 308, and 310 in the resist 312 below. In one embodiment, the slit 212 is 26 mm wide and about 5 mm-7 mm long. The slit 212 scans the exposure window 210 from the top blade 202 to the bottom blade 204.

The method disclosed above is applicable to any device size on any substrate size. The exposure window 210 can create an area to be exposure of up to 26 mm wide and 33 mm long. The device pattern size, such as patterns 306, 308, and 310, can be larger than 26 mm by 33 mm. Should the device pattern size be larger than 26 mm by 33 mm, a stitching method is used where two exposure windows are utilized sequentially, each 26 mm by 33 mm or smaller. The exposure windows are placed directly next to each other creating a larger pattern size, such as patterns 306, 308, and 310.

Different heights of the topographic features are created by different doses of light. The dose of light is varied by the exposure times of the resist 312. A greater dose of light equates to a longer exposure time. A longer exposure time will create a greater height in the resist 312 due to increase cross linking with increased exposure time. A shorter exposure time will create a thinner layer due to less cross linking during a shorter exposure time.

Figure 4:
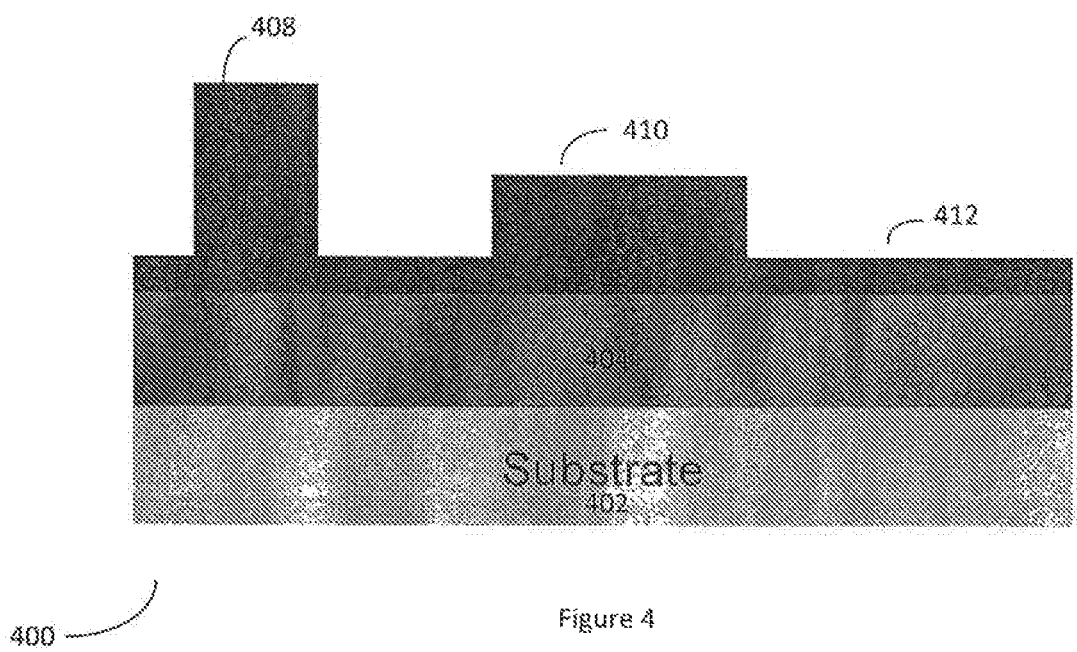
FIG. 4 is a resulting product from an exposure method disclosed herein.

FIG. 4 is a resulting product 400 from an exposure method disclosed herein. An optical device layer 404 is deposited onto a substrate 402. In one embodiment, the optical device layer 404 comprises a metal oxide material. In one embodiment, the metal oxide material comprise a material selected from the group consisting of TiOx, NbOx, SbOx, ZrOx, AlOx, HfOx, WOx, ZnOx, or combinations thereof. The concentration of metal oxide contents inside the resist 406 is designed based on the desired film refractive index. Varying the concentration of the metal oxide material allows for manipulation of the refractive index of the features. In one embodiment, the total refractive index range is about 1.3 and 2.5 under optical visible light.

The resulting product 400 includes a substrate 402 with an optical device layer 404 disposed thereon. The resist 406 is deposited onto the optical device layer 404 using methods disclosed herein. The resist 406 is a negative tone resist. The resist 406 will remain on the substrate 402 post exposure and development. At least two topographic features 408, 410, and 412 are created in the resist 406 according to their corresponding exposure pattern. The substrate 402 can be used directly after exposure and development.

Figure 5A:
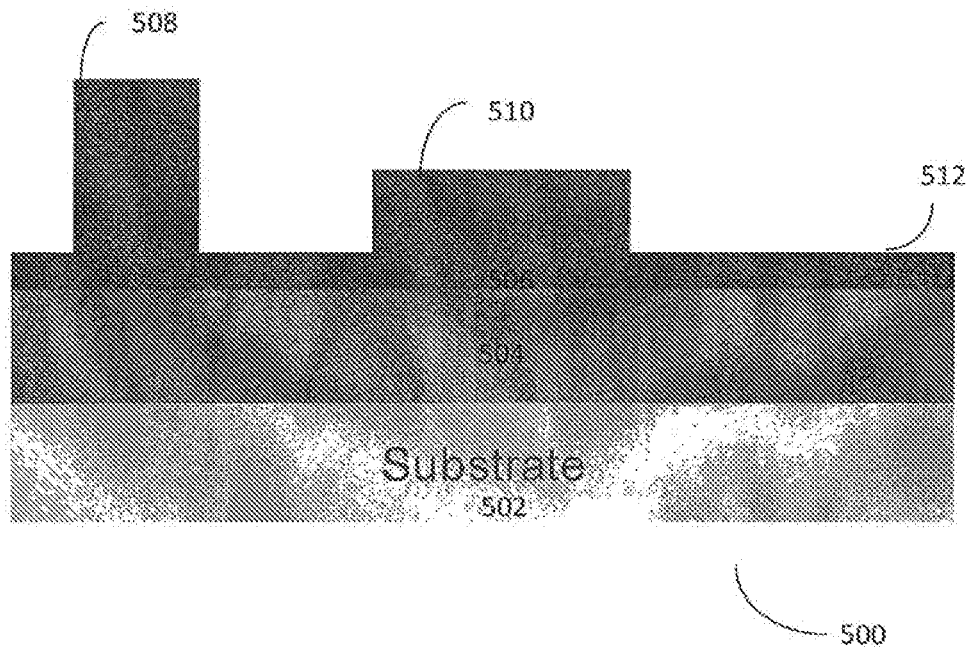
FIG. 5A is a resulting intermediate product from an exposure method disclosed herein.
Figure 5B:
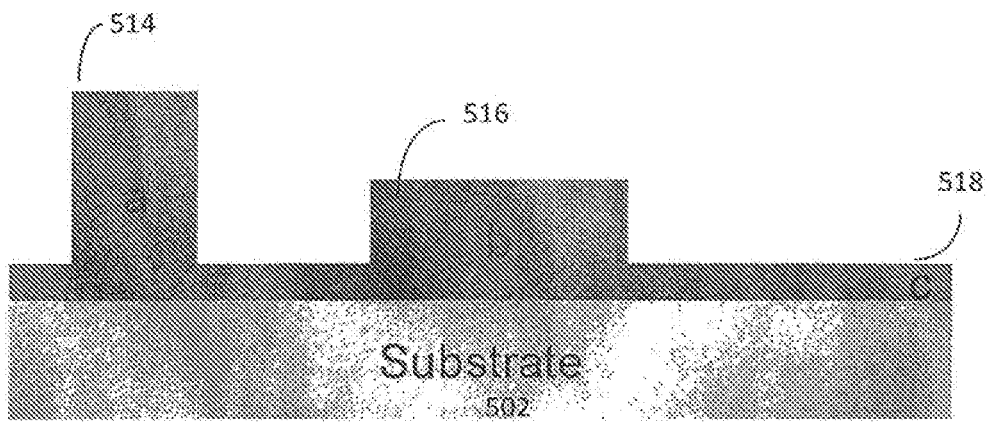
FIG. 5B is a resulting product from using the intermediate product of FIG. 5A.

FIG. 5A is a resulting intermediate product 500 from an exposure method disclosed herein. FIG. 5B is a resulting product 550 from using the intermediate product of FIG. 5A. The intermediate product 500 contains a substrate 502 with an optical device layer 504 disposed thereon. In one embodiment, the optical device layer 504 comprises a metal oxide material. In one embodiment, the metal oxide material comprise a material selected from the group consisting of TiOx, NbOx, SbOx, ZrOx, AlOx, HfOx, WOx, ZnOx, or combinations thereof. The concentration of metal oxide contents inside the resist 406 is designed based on the desired film refractive index. Varying the concentration of the metal oxide material allows for manipulation of the refractive index of the features.

The resist 506 is deposited onto the optical device layer 504 using methods disclosed herein. The resist 506 is a negative tone resist. At least two topographic features 508, 510, and 512 are created in the resist 506 according to their corresponding exposure pattern. In one embodiment, the resist 506 is further processed to form an optical device having structures formed in the topographic features 508, 510, and 512. The structures formed in at least one of the topographic features 508, 510, and 512 are different. The structures having variable heights formed in the topographic features 508, 510, and 512 may be nanostructures having dimensions less than 1 μm. In one embodiment, the optical device is a waveguide combiner, such as an augmented reality waveguide combiner. In another embodiment, the optical device is a flat optical device, such as a metasurface.

The resulting product 550 is created after etching the intermediate product 500. The etch rate of the material will be about one-to-one. Etching the product 500 will result in product 550 with topographic features 514, 516, and 518 developed in the optical device layer 504. In one embodiment, the optical device layer 504 is further processed to form an optical device having structures formed in the topographic features 514, 516, and 518. The structures formed in at least one of the topographic features 514, 516, and 518 are different. The structures having variable heights formed in the topographic features 514, 516, and 518 may be nanostructures having dimensions less than 1 μm. In one embodiment, the optical device is a waveguide combiner, such as an augmented reality waveguide combiner. In another embodiment, the optical device is a flat optical device, such as a metasurface.

Figure 6A:
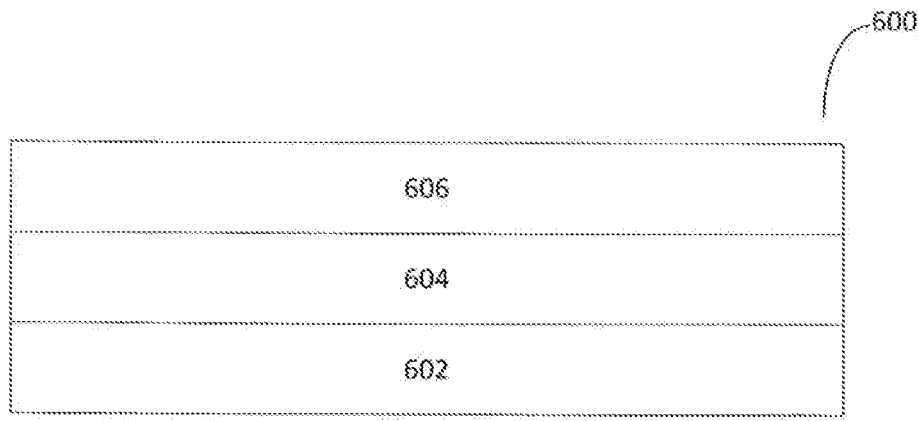
FIGS. 6A-6C are schematic illustrations of a product at various stages of manufacture using the methods disclosed herein.
Figure 6B:
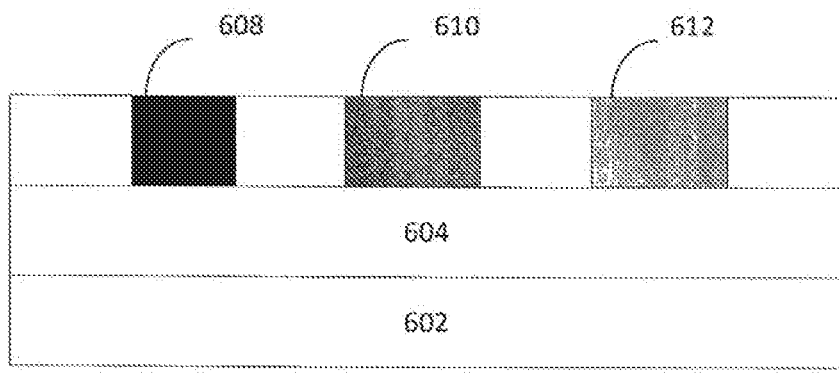
Figure 6C:
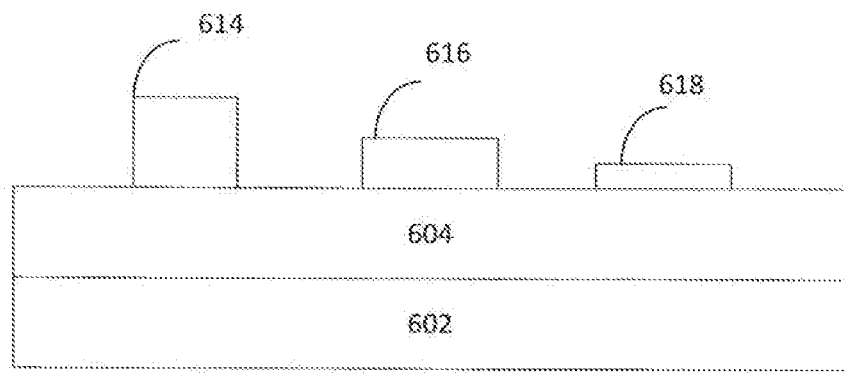

FIGS. 6A-6C are schematic illustrations of a product 600 at various stages of manufacture using the methods disclosed herein. Product 600 is comprised of a substrate 602, an optical device layer 604, and a resist layer 606. In one embodiment, the substrate 602 is comprised of a silicon material. In another embodiment, the substrate 602 is made of glass. In one embodiment, the optical device layer 604 comprises a metal oxide material. In one embodiment, the metal oxide material comprise a material selected from the group consisting of TiOx, NbOx, SbOx, ZrOx, AlOx, HfOx, WOx, ZnOx, or combinations thereof. In one embodiment, the resist layer 606 comprises a metal oxide material. In one embodiment, the metal oxide material comprise a material selected from the group consisting of TiOx, NbOx, SbOx, ZrOx, AlOx, HfOx, WOx, ZnOx, or combinations thereof. FIG. 6A depicts the product build up prior to exposure. FIG. 6B depicts the product 600 after exposure and before development. FIG. 6B depicts various features 608, 610, and 612 after exposure. FIG. 6C depicts a resulting product after development with developed features 614, 616, and 618.

Figure 7:
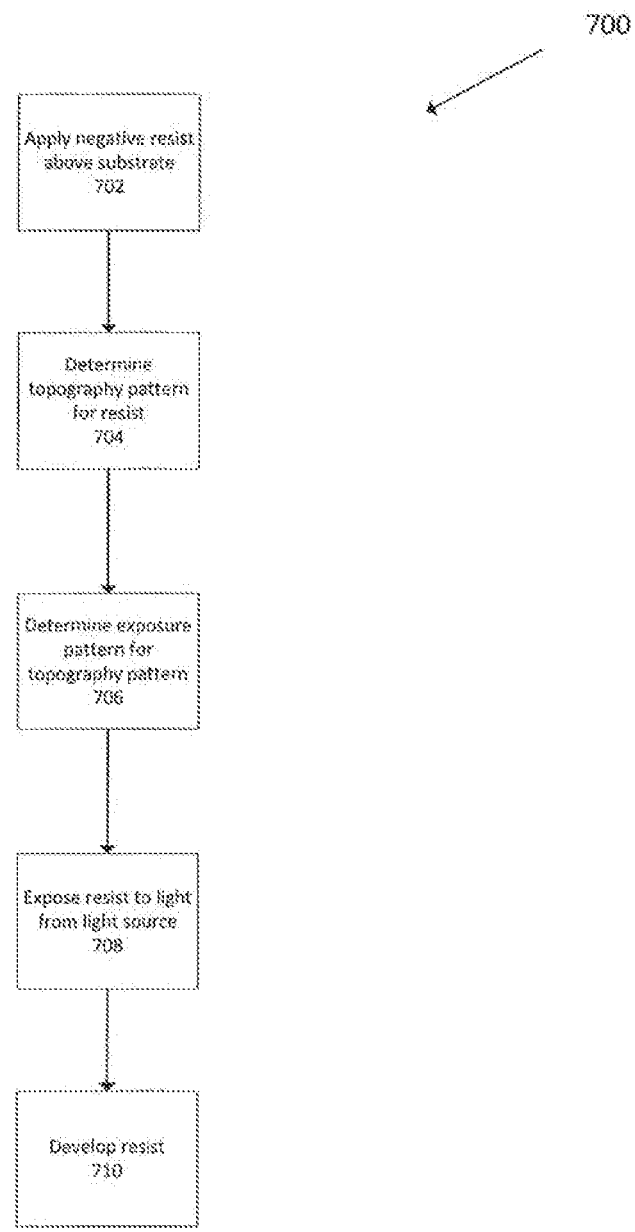
FIG. 7 is a flowchart illustrating a method of manufacturing a product according to one embodiment.

FIG. 7 is a flowchart illustrating method 700 of manufacturing an end product having multiple topographic features. At operation 702, a negative tone resist, such as resist 606, is applied onto a substrate, such as substrate 602. At operation 704, the topographic patterns for the resist are determined according to their desired exposure patterns. The topographic patterns determined at operation 704 will determine the size of the device pattern, such as device patterns 306, 308, and 310. At operation 706, the exposure pattern is determined for the topography pattern according the determined topographical patterns. The exposure pattern determined at operation 706 will determine the height of the topographic features developed in the resist. At operation 708, the resist, such as resist 606, is exposed to the light 110 from the light source 102. At operation 710, the resist is developed. The substrate can be used directly after exposure and development as described at operations 708 and 710.

By utilizing different exposure levels to different areas of a resist, a resulting product having different topography can be produced without the use of a mask.

While the foregoing is directed to embodiments of the present disclosure, other and further embodiments of the disclosure may be devised without departing from the basic scope thereof, and the scope thereof is determined by the claims that follow.

What is claimed is:

1. A method of fabricating a device having at least two features of differing heights, comprising:
    depositing a resist over a substrate;
    determining a topography pattern for the at least two features of the device, the two features having different topography;
    determining an exposure pattern for the at least two features of the device;
    exposing a first area of the resist with a first dose of light through a first exposure window, wherein edges of four blades define the first exposure window and the first exposure window defines the first area, the first area corresponding to a first feature of the at least two features;
    exposing a second area of the resist with a second dose of light that is different from the first dose of light through a second exposure window, wherein the edges of the four blades define the second exposure window and the second exposure window defines the second area, the second area different than the first area, the second area corresponding to a second feature of the at least two features, wherein the exposing of the second area of the resist occurs after the exposing of the first area of the resist; and
    developing the resist.

2. The method of claim 1, wherein the first dose of light is greater than the second dose of light.

3. The method of claim 1, wherein the first feature has a greater height than the second feature.

4. The method of claim 1, wherein the resist comprises a metal oxide material.

5. The method of claim 4, wherein the metal oxide material comprise a material selected from the group consisting of titanium oxide, niobium oxide, antimony oxide, zirconium oxide, aluminum oxide, hafnium oxide, tungsten oxide, zinc oxide, and combinations thereof.

6. The method of claim 1, wherein the resist is a negative tone resist.

7. The method of claim 1, wherein the resist has a refractive index of between 1.3 to 2.5.

8. The method of claim 1, wherein both exposing the first area and exposing the second area is performed without a mask.

9. A method of fabricating a device having at least two features of differing heights, comprising:
    depositing a resist over a substrate;
    determining a topography pattern for the at least two features of the device, the two features having different topography;
    adjusting a plurality of blades of an exposure apparatus to create a first exposure window that corresponds to a first feature of the at least two features, wherein four edges of the plurality of blades define the first exposure window;

exposing a first area of the resist with a first dose of light through the first exposure window, the first area of the resist corresponding to the first exposure window;

adjusting the plurality of blades to create a second exposure window that corresponds to a second feature of the at least two features, wherein the four edges of the plurality of blades define the second exposure window;

exposing a second area of the resist with a second dose of light that is different from the first dose of light through the second exposure window, the second area of the resist corresponding to the second exposure window, the second area different than the first area, wherein the exposing of the second area of the resist occurs after the exposing of the first area of the resist; and developing the resist.

10. The method of claim 9, wherein the first dose of light is greater than the second dose of light.

11. The method of claim 9, wherein the first feature has a greater height than the second feature.

12. The method of claim 9, wherein the resist comprises a metal oxide material.

13. The method of claim 12, wherein the metal oxide material comprise a material selected from the group consisting of titanium oxide, niobium oxide, antimony oxide, zirconium oxide, aluminum oxide, hafnium oxide, tungsten oxide, zinc oxide, and combinations thereof.

14. The method of claim 9, wherein the resist is a negative tone resist.

15. The method of claim 9, wherein the resist has a refractive index of between 1.3 to 2.5.

16. The method of claim 9, wherein both exposing the first area and exposing the second area is performed without a mask.

17. A method of fabricating a device having at least two features of differing heights, comprising:

depositing a resist on an optical device layer, the optical device layer disposed over a substrate;

determining a topography pattern for the at least two features of the device, the two features having different topography;

determining an exposure pattern for the at least two features of the device;

exposing a first area of the resist with a first dose of light through a first exposure window, wherein edges of four blades define the first exposure window and the first exposure window defines the first area, the first area corresponding to a first feature of the at least two features;

exposing a second area of the resist with a second dose of light that is different from the first dose of light through a second exposure window, wherein the second exposure window defines the second area and the second exposure window defines the second area, the second area different than the first area, the second area corresponding to a second feature of the at least two features, wherein the exposing of the second area of the resist occurs after the exposing of the first area of the resist;

developing the resist; and etching the resist and the optical device layer.

18. The method of claim 17, wherein the optical device layer comprise a material selected from the group consisting of titanium oxide, niobium oxide, antimony oxide, zirconium oxide, aluminum oxide, hafnium oxide, tungsten oxide, zinc oxide, and combinations thereof.

19. The method of claim 17, wherein resist comprises a material selected from the group consisting of The method of claim 4, wherein the metal oxide material comprise a material selected from the group consisting of titanium oxide, niobium oxide, antimony oxide, zirconium oxide, aluminum oxide, hafnium oxide, tungsten oxide, zinc oxide, and combinations thereof.

20. The method of claim 17, wherein the resist is a negative tone resist.

* * * * *